US009286648B2

(12) United States Patent  
Lefebvre et al.

(10) Patent No.: US 9,286,648 B2  
(45) Date of Patent: Mar. 15, 2016

(54) ZERO COMMUNICATION BLOCK PARTITIONING

(71) Applicant: Mariappan S. Nadar, Plainsboro, NJ (US)

(72) Inventors: Alban Lefebvre, Jersey City, NJ (US); Axel Loewe, Monmouth Junction, NJ (US); Mariappan S. Nadar, Plainsboro, NJ (US); Jun Liu, Plainsboro, NJ (US)

( * ) Notice: Subject to any disclaimer, the term of this patent is extended or adjusted under 35 U.S.C. 154(b) by 298 days.

(21) Appl. No.: 13/950,535

(22) Filed: Jul. 25, 2013

(65) Prior Publication Data

US 2014/0037228 A1 Feb. 6, 2014

Related U.S. Application Data

(60) Provisional application No. 61/679,132, filed on Aug. 3, 2012.

(51) Int. Cl.

| G06K 9/54 | (2006.01) |
| G06T 1/20 | (2006.01) |
| G01R 33/56 | (2006.01) |

(52) U.S. Cl.  
CPC .............. *G06T 1/20* (2013.01); *G01R 33/5608* (2013.01)

(58) Field of Classification Search  
None  
See application file for complete search history.

(56) References Cited

U.S. PATENT DOCUMENTS

| 5,859,788 | A  | * | 1/1999  | Hou .............................. 708/400 |
| 6,151,420 | A  | * | 11/2000 | Wober et al. .................. 382/275 |
| 6,233,357 | B1 | * | 5/2001  | Li et al. ......................... 382/248 |
| 6,501,863 | B1 | * | 12/2002 | Fukuhara et al. ............. 382/251 |
| 6,738,523 | B1 | * | 5/2004  | Small et al. ................... 382/240 |
| 6,813,387 | B1 | * | 11/2004 | Berkner et al. ............... 382/240 |
| 7,640,284 | B1 | * | 12/2009 | Goodnight et al. ........... 708/404 |
| 2001/0024530 | A1 | * | 9/2001  | Fukuhara et al. ............. 382/240 |
| 2004/0021587 | A1 | * | 2/2004  | Hashirano ....................... 341/50 |
| 2004/0136596 | A1 | * | 7/2004  | Oneda et al. .................. 382/232 |
| 2004/0218826 | A1 | * | 11/2004 | Terao ............................ 382/240 |
| 2005/0047513 | A1 | * | 3/2005  | Vitenberg ..................... 375/260 |
| 2005/0100230 | A1 | * | 5/2005  | Moore .......................... 382/232 |
| 2010/0061643 | A1 | * | 3/2010  | Fukuhara et al. ............. 382/232 |
| 2010/0207942 | A1 | * | 8/2010  | Zhao ............................. 345/424 |
| 2010/0218196 | A1 | * | 8/2010  | Leung et al. .................. 718/107 |
| 2011/0035737 | A1 | * | 2/2011  | Stefansson et al. ........... 717/149 |
| 2011/0182352 | A1 | * | 7/2011  | Pace ........................... 375/240.1 |
| 2011/0238948 | A1 | * | 9/2011  | Vorbach et al. ................. 712/15 |
| 2012/0320070 | A1 | * | 12/2012 | Arvo ............................. 345/522 |
| 2013/0016110 | A1 | * | 1/2013  | Arvo ............................. 345/522 |

* cited by examiner

*Primary Examiner* — Wenpeng Chen

(57) ABSTRACT

A computer-implemented method for calculating a multi-dimensional wavelet transform in an image processing system comprising a plurality of computation units includes receiving multi-dimensional image data. An overlap value corresponding to a number of non-zero filter coefficients associated with the multi-dimensional wavelet transform is identified. Then the multi-dimensional image data is divided into a plurality of multi-dimensional arrays, wherein the multi-dimensional arrays overlap in each dimension by a number of pixels equal to the overlap value. A multi-dimensional wavelet transform is calculated for each multi-dimensional array, in parallel, across the plurality of computation units.

18 Claims, 7 Drawing Sheets

ZERO COMMUNICATION BLOCK PARTITIONING

CROSS-REFERENCE TO RELATED APPLICATIONS

This application claims priority to U.S. provisional application Ser. No. 61/679,132 filed Aug. 3, 2012, which is incorporated herein by reference in its entirety.

TECHNOLOGY FIELD

The present invention relates generally to methods, systems, and apparatuses for calculating a multi-dimensional wavelet transform of data in a parallel computing environment where data is partitioned into arrays, such that the wavelet transform may be computed for each array independently on different computation units. The disclosed methods, systems, and apparatuses may be applied to, for example, increase the speed and accuracy of Magnetic Resonance Imaging reconstruction.

BACKGROUND

Parallel computing architectures can be utilized to increase the efficiency of computing a multi-dimensional wavelet transform for signal data. The speed, accuracy, and efficiency of the transform calculating in such architectures may depend on factors such as how data is partitioned, the particular type of wavelets used in the transform, and the hardware utilized when performing the transform.

A common technique is to divide the input data into one-dimensional arrays. For each of those arrays, a one-dimensional wavelet transform is performed on a computation unit (e.g., a processor core or thread block) and the result is written back to memory. In further steps, the same procedure is done for the other dimensions of the data, with new geometric decompositions. This technique allows the transform to be performed in a parallel computing environment, thus providing some increase in the speed of the transform calculation. However, the technique has traditionally required calculation between each one-dimensional array during the transform calculation. This communication introduces a time latency into the calculation which may be unacceptable for many applications.

Several approaches have been developed to compute multi-dimensional wavelet transforms while minimizing the communication between computation units. However, an efficient parallelized implementation of a wavelet transform would preferably require no communication between the computation units. Thus, it would be desirable to utilize a parallelized multi-dimensional wavelet transform that allows each computation unit to perform its portion of the wavelet transform calculation independent of the other computation units.

Reducing or eliminating the communication latencies required for wavelet transforms can benefit various domains. For example, wavelet transforms may be used in Magnetic Resonance Imaging ("MRI") reconstruction procedures. As would be understood by one skilled in the art, the clarity of MRI images is highly dependently on the motion of the item being scanned. Thus, for example, involuntary movements of a patient's heart or lungs during MRI scanning can blur the resultant image. Techniques such as compressed sensing have be introduced to reduce the time require for scanning, however these techniques have traditionally required time-intensive image processing before medical personnel can review the image. In turn, this processing delays the treatment of the patient. Therefore, it would be desirable to minimize the time required for processing a MRI image acquired using compressed sensing techniques so that the MRI image can be quickly presented to medical personnel to facilitate treatment of the patient.

SUMMARY

Embodiments of the present invention address and overcome one or more of the above shortcomings and drawbacks, by providing methods, systems, and apparatuses which calculate a multi-dimensional wavelet transform in an image processing system. The input signal to the transform is partitioned into multi-dimensional arrays which are then used to perform the wavelet transform. The signal is partitioned such that no communication between the arrays is required to compute the transform. This technology is particularly well-suited for, but by no means limited to, image processing applications where compressed sensing techniques are used. For example, for Magnetic Resonance Imaging (MRI) procedures where compressed sensing techniques are used, the technology described herein may be applied to reduce the time required to perform the reconstruction procedure on the acquired compressed images.

Embodiments of the present invention are directed to a computer-implemented method for calculating a multi-dimensional wavelet transform in an image processing system comprising a plurality of computation units includes receiving multi-dimensional image data. An overlap value corresponding to a number of non-zero filter coefficients associated with the multi-dimensional wavelet transform is identified. Then, the multi-dimensional image data is divided into a plurality of multi-dimensional arrays, wherein the multi-dimensional arrays overlap in each dimension by a number of pixels equal to the overlap value. A multi-dimensional wavelet transform is then calculated for each multi-dimensional array, in parallel, across the plurality of computation units. Following this calculation, a multi-dimensional wavelet transform result may be received from each of the plurality of computation units and aggregated in a memory included in the image processing system.

According to one aspect of the invention, the calculating of the multi-dimensional wavelet transform for each multi-dimensional array, in parallel, across the plurality of computation units comprises receiving, by a respective computation unit, an assigned multi-dimensional array. The respective computation unit calculates a wavelet transform across each dimension of the assigned multi-dimensional array and identifies a final wavelet transform result for the multi-dimensional array. The final wavelet transform result is copied from the respective computation unit to each of the plurality of computation units. The identification of the final wavelet transform result for the multi-dimensional array may include determining, by the respective computation unit, a calculated wavelet transform result for the assigned multi-dimensional array based on the calculation of the wavelet transform across each dimension of the assigned multi-dimensional array; identifying, by the respective computation unit, values in the calculated wavelet transform result corresponding to an overlap between the assigned multi-dimensional array and one or more of the plurality of multi-dimensional arrays; and excluding the values from the calculated wavelet transform result to identify the final wavelet transform result.

According to another aspect of the invention, copying the final wavelet transform result from the respective computation unit to each of the plurality of computation units comprises identifying values in the final wavelet transform result which correspond to an overlap between the assigned multi-dimensional array and one or more of the plurality of multi-dimensional arrays; and copying all values in the final wavelet transform result from the respective computation unit except for those values corresponding to the overlap.

In some embodiments of the invention, the image processing system comprises a plurality of computers operable coupled via a network and each computation unit is located within a distinct computer. In other embodiments of the invention, the plurality of computation units are thread blocks in a graphical processing unit. The size of each multi-dimensional array may be based on a maximum number of threads available to each thread block and/or an amount of memory exclusively available to each thread block.

Other embodiments of the present invention are directed to a method for calculating a transform of a multi-dimensional signal in a system comprising a plurality of computation units. The method includes dividing, in a first memory associated with the computer, data corresponding to the multi-dimensional signal into a plurality of multi-dimensional arrays, wherein the multi-dimensional arrays overlap in each dimension. Each multi-dimensional array is assigned to one of the plurality of computation units and, for each computation unit, a transform calculation process is performed. In some embodiments, the transform calculation process comprises copying an assigned multi-dimensional array from the first memory to a second memory, wherein the second memory in only accessible to the respective computation unit, calculating the transform along each dimension of the assigned multi-dimensional array in the second memory, and copying a final result of the transform along a last dimension to first memory.

According to one aspect of the invention the transform calculation process is performed independently by each computation unit without communicating with any other computation unit in the plurality of computation units. The transform calculation process may be performed by each computation unit, on its respective multi-dimensional array, in parallel. In some embodiments of the invention, the plurality of computation units are thread blocks in a graphical processing unit. In some embodiments of the invention, the transform is a discrete wavelet transform or an inverse discrete wavelet transform.

According to another aspect of the invention, copying a final result of the transform along a last dimension to the first memory comprises identifying the calculated result of the transform along the last dimension to first memory; identifying overlap values in the final result corresponding to an overlap between the assigned multi-dimensional array and one or more of the plurality of multi-dimensional arrays; and copying all values from the calculated result with the exception of the overlap values to the first memory.

Embodiments of the present invention are also directed to an image processing system for calculating a multi-dimensional wavelet transform. The system comprises an imaging device configured to capture a multi-dimensional image and an imaging computer. In one embodiment of the present invention, the imaging device included in the system is a Magnetic Resonance Imaging Device. The imaging computer may comprise a receive, a first processor comprising a plurality of computation units, and a second processor configured to call a software function operable to cause the first processor execute one or more instructions. In some embodiments, the first processor is a graphical processing unit and the plurality of computation units each correspond to a thread block.

In one embodiment of the invention, the instructions executed by the first processor result in the first processor dividing the multi-dimensional image data into a plurality of overlapping multi-dimensional arrays. The multi-dimensional arrays may overlap, for example, by a number of pixels corresponding to a number of non-zero filter coefficients associated with the multi-dimensional wavelet transform. In these embodiments, a multi-dimensional wavelet transform may be calculated for each multi-dimensional array, in parallel, across the plurality of computation units Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at performing multi-dimensional wavelet transforms in parallel computing architectures. The invention is particularly well-suited to image processing applications including, but not limited to, MRI reconstruction. However, one skilled in the art would recognize that the techniques described herein may be applicable to various domains where multi-dimensional wavelet transforms are performed.

Figure 1:
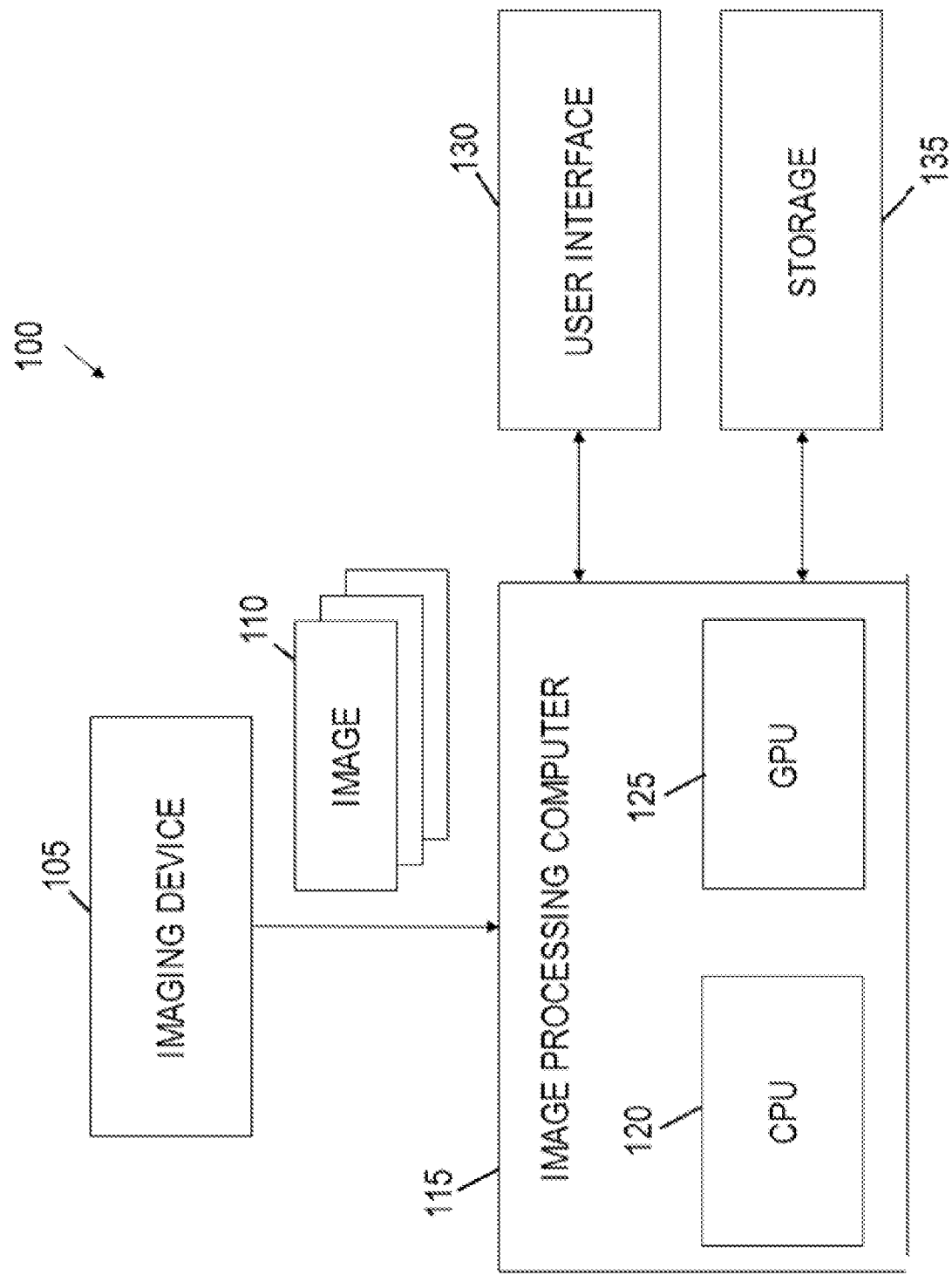
FIG. 1 is a system diagram of an imaging system according to some embodiments of the present invention.

FIG. 1 is a system diagram of an imaging system 100, according to some embodiments of the present invention. An imaging device 105 transfers one or more images 110 to an image processing computer 115. In one embodiment, the imaging device 105 is a MRI device. In the example of FIG.

1, the image processing computer 115 includes one or more central processing units (CPUs) 120 and one or more graphics processing units (GPUs) 125. As is well understood in the art, the use of CPUs in combination with GPUs provides various computation advantages in engineering applications, including potentially reducing the time required to process computationally intense algorithms. The imaging device 105 and the image processing computer 115 may be connected directly or indirectly using any technique known in the art. Thus, for example, in some embodiments the imaging device 105 and the image processing computer 115 are directly connected using a proprietary cable or an industry standard cable such as a Universal Serial Bus (USB) cable. In other embodiments, the imaging device 105 and the image processing computer 115 are indirectly connected over one or more networks (not shown in FIG. 1). These networks may be wired, wireless or a combination thereof.

The imaging system 100 may include one or more computing units (not shown in FIG. 1). The term computing unit refers to any hardware and/or software configuration capable of executing a series of instruction. The computing unit can be defined in various levels of granularity. Thus, in some embodiments, the CPU is the computing unit while in other embodiments the processing cores within the CPU are the computing unit. In other embodiments, the computation unit is a thread block executed on a GPU. It should be noted that the number of computing units can scale based on the number of CPUs and/or GPUs available to the system 100. Thus, if the imaging system 100 includes multiple imaging computers, each imaging computer would offer one or more computation units for use by the system 100.

Continuing with reference to FIG. 1, a user interface 130 is connected directly or indirectly to the image processing computer 115. The user interface 130 may include any interface known in the art including, for example and without limitation, a display, a keyboard, a mouse, and/or a touchscreen. Storage 135 is also connected, either directly or indirectly, to the image processing computer 115. In some embodiments, the image processing computer 115 may communicate with the storage 135 to retrieve images (not shown in FIG. 1) as an alternative to receiving images 110 from the imaging device 105. Storage 135 may be implemented using any technique known in the art and may utilize, for example, any combination of magnetic, semi-conductor, and/or optical storage media.

The present invention may be implemented across various computing architectures. In the example of FIG. 1, the invention is implemented on a single image processing computer 115 comprising both CPUs and GPUs. In some embodiments, a multi-dimensional wavelet transform, as described herein, may be performed using only CPUs or using a combination of CPUs and GPUs. In one embodiment, a parallel computing platform and programming model such as the NVIDIA™ Compute Unified Device Architecture (CUDA) may be used to optimize usage of the GPUs in computing the multi-dimensional wavelet transform. However, it should be noted that the imaging system 100 illustrated in FIG. 1 is merely one example of an imaging system that may be used to implement the present invention. For example, in some embodiments, an imaging system includes multiple image processing computers directly or indirectly connected together in a cluster configuration.

Figure 2:
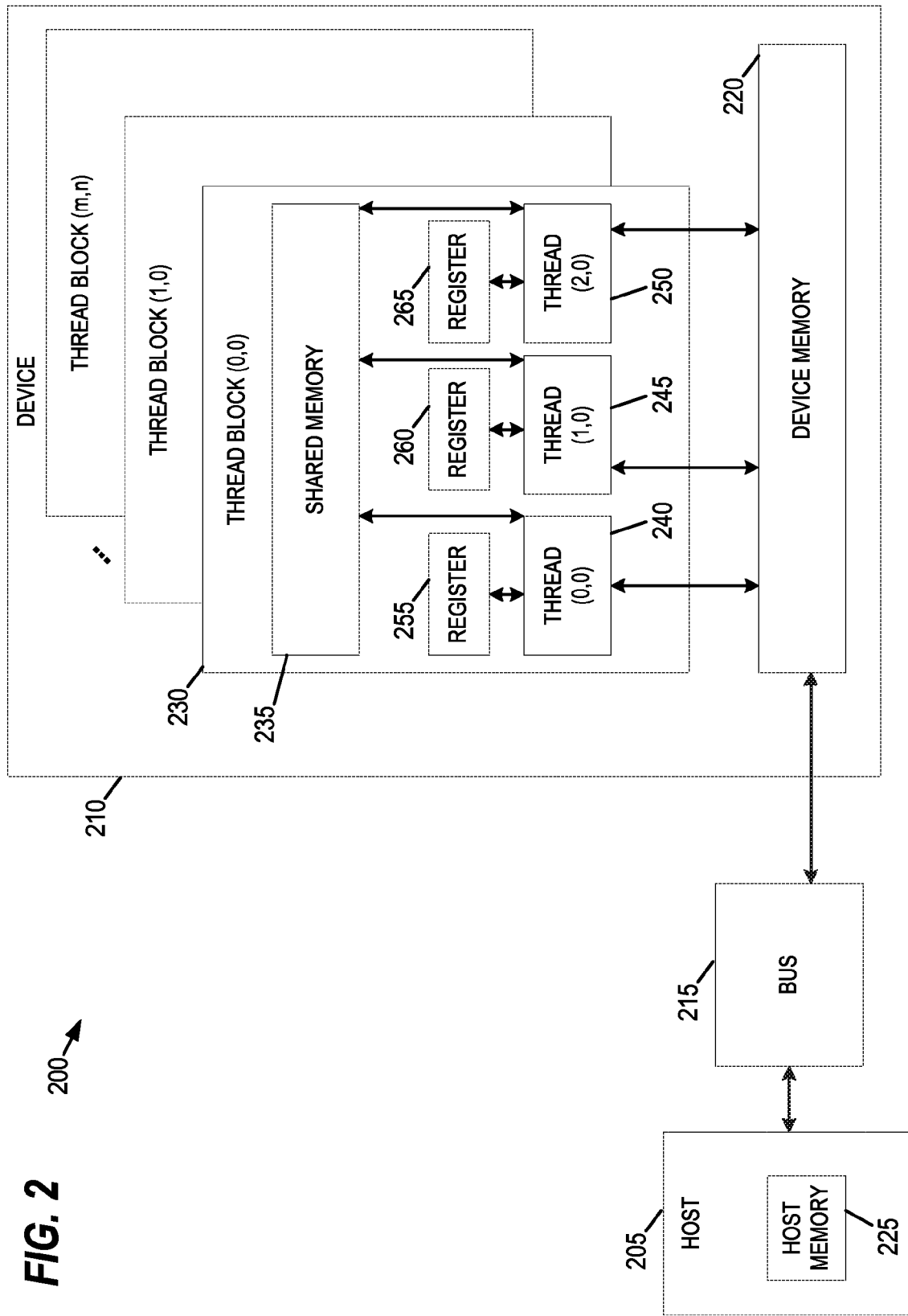
FIG. 2 provides an illustration of a memory architecture utilized by an image processing computer according to embodiments of the present invention utilizing GPUs to perform computations related to a multi-dimensional wavelet transform.

FIG. 2 provides an illustration of the memory architecture 200 utilized by the image processing computer 115 according to embodiments of the present invention utilizing GPUs to perform computations related to a multi-dimensional wavelet transform. This architecture may be used, for example, for implementations of the present invention where NVIDIA™ CUDA (or a similar parallel computing platform) is used. The architecture includes a host 205 and a device 210 connected via a bus 215 (e.g., a PCIe bus). The host 205 includes the CPU (not shown in FIG. 2) and host memory 225 accessible to the CPU. The device 210 includes the GPU and its associated memory 220, referred to herein as device memory. The device memory 220 may include various types of memory, each optimized for different memory usages. For example, in some embodiments, the device memory includes global memory, constant memory, and texture memory.

The device 210 includes one or more thread blocks 230 which represent the computation unit of the device. The term thread block refers to a group of threads that can cooperate via shared memory and synchronize their execution to coordinate memory accesses. For example, in FIG. 2, threads 240, 245 and 250 operate in thread block 230 and access shared memory 235. Depending on the parallel computing platform used, thread blocks may be organized in a grid structure. A computation or series of computations may then be mapped onto this grid. For example, in embodiments utilizing CUDA, computations may be mapped on a one-, two-, or three-dimensional grids. Each grid contains multiple thread blocks, and each thread block contains multiple threads. For example, in FIG. 2, the thread blocks 230 are organized in a two dimensional grid structure with m+1 rows and n+1 columns. Generally, threads in different thread blocks of the same grid cannot communicate or synchronize with each other. However, thread blocks in the same grid can run on the same multiprocessor within the GPU at the same time. The number of threads in each thread block may be limited by hardware or software constraints.

Continuing with reference to FIG. 2, registers 255, 260, and 265 represent the fast memory available to thread block 230. Each register is only accessible by a single thread. Thus, for example, register 255 may only be accessed by thread 240. Conversely, shared memory is allocated per thread block, so all threads in the block have access to the same shared memory. Thus, shared memory 235 is designed to be accessed, in parallel, by each thread 240, 245, and 250 in thread block 230. Threads can access data in shared memory 235 loaded from device memory 220 by other threads within the same thread block (e.g., thread block 230). The device memory 220 is accessed by all blocks of the grid and may be implemented using, for example, Dynamic Random-Access Memory (DRAM).

Each thread can have one or more levels of memory access. For example, in the memory architecture 200 of FIG. 2, each thread may have three levels of memory access. First, each thread 240, 245, 250, can read and write to its corresponding registers 255, 260, and 265. Registers provide the fastest memory access to threads because they are no synchronization issues and the register is generally located close to multiprocessor executing the thread. Second, each thread 240, 245, 250 in thread block 230, may read and write data to the shared memory 235 corresponding to that block 230. Generally, the time required for a thread to access shared memory exceeds that of register access due to the need to synchronize access among all the threads in the thread block. However, like the registers in the thread block, the shared memory is typically located close to the multiprocessor executing the threads. The third level of memory access allows all threads on the device 210 to read and/or write to the device memory. Device memory requires the longest time to access because access must be synchronized across the thread blocks operating on the device. Thus, ideally computations executed on a device, such as device 210, would primarily utilize registers and shared memory and only utilize device memory as necessary when moving data in and out of a thread block.

The software utilized to perform the multi-dimensional wavelet transform described herein may vary depending on the memory architecture used by the imaging system 100. For example, in embodiments where all processing occurs on CPUs, multi-processing APIs such as OpenMP can be used in conjunction with math libraries such as Intel™ MKL DFTI. In embodiments, where processing occurs on a GPU, software such as CUDA may be used in conjunction with libraries such as cuFFT and cuBLAS, as well as functions from the CUDA runtime API and/or the CUDA driver API.

Figure 3:
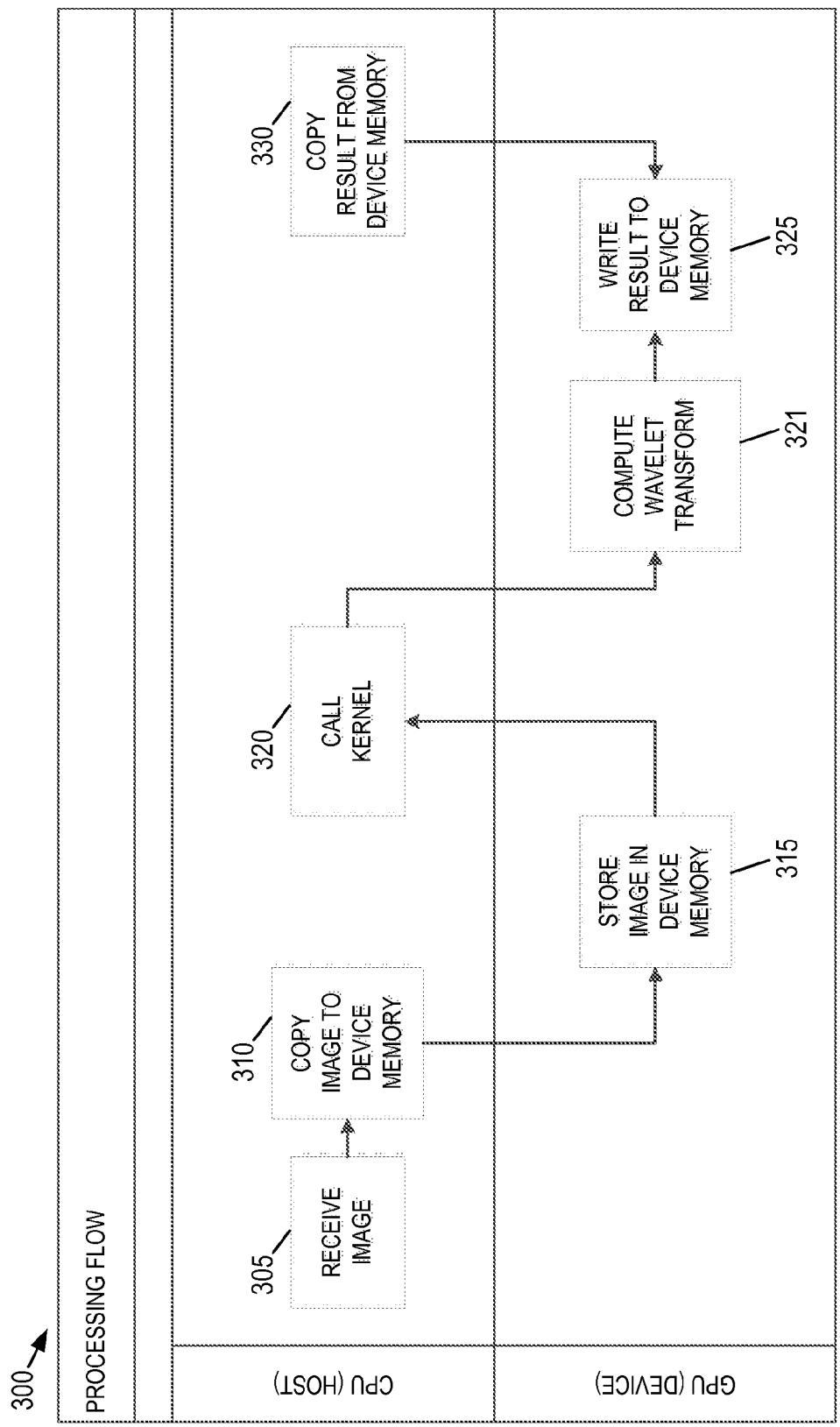
FIG. 3 provides a flowchart illustrating how images are processed by an image processing computer according to some embodiments of the present invention.

FIG. 3 provides a flowchart 300 illustrating how images are processed by the image processing computer 115 utilizing the memory architecture 200 according to some embodiments of the present invention. At 305, the host 205 receives an image, for example, via imaging device 105 and stores it in host memory 225. Next, at 310, the host 205 copies the image from host memory 225 to device memory at the device 210 where it is stored at 315. This copying may be performed, for example, by calling a memory copy function provided by an API associated with the parallel computing platform.

Next, at 320, the host 205 calls a software function referred to herein as a "kernel." The term kernel refers to a function callable from host 205 and executed by many threads simultaneously on device 210. In some embodiments, for example where device 210 supports CUDA, the host may be called by specifying the name of the kernel and an execution configuration. The execution configuration may define, for example, the number of threads in each thread block and the number of thread locks to use when executing the kernel on the device.

Continuing with reference to FIG. 3, calling the kernel results in the software being executed on the device 210 to compute a multi-dimensional wavelet transform for the image. The execution of this software is illustrated in FIG. 3 at 321 and described in further detail below with respect to FIGS. 4, 5, and 6. After the wavelet transform has been performed, at 325, the device 210 writes the result of the transform to device memory 220 at 325. Finally, at 330, the host 205 copies the result from device memory 220 to host memory 225.

Figure 4:
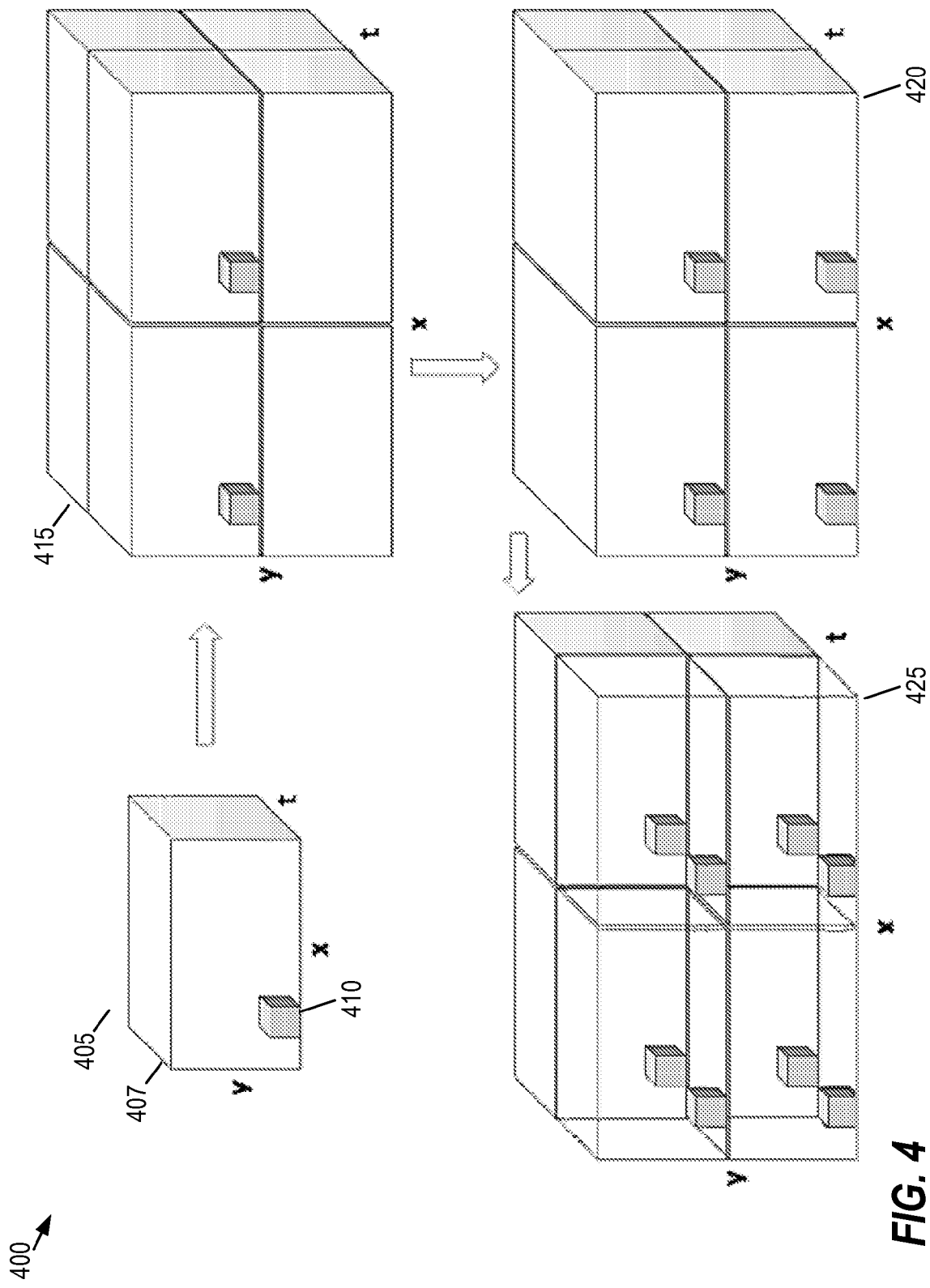
FIG. 4 is an illustration of a method of partitioning data for processing across multiple computation units in preparation of computing a multi-dimensional wavelet transform, according to some embodiments of the present invention.

FIG. 4 is an illustration 400 of a method of partitioning data for processing across multiple computation units in preparation of computing a multi-dimensional wavelet transform, according to some embodiments of the present invention. This partitioning illustrated in FIG. 4 is performed such that no communication is required between the computation units (e.g., thread block) in order to process the data when computing the transform. The data is portioned into multi-dimensional arrays, with the number of dimensions corresponding to the dimensions of the data. For example, in FIG. 4, the cuboid 410 represents a three-dimensional array of data. Each multi-dimensional array includes all values needed to compute a wavelet transform across all its dimensions. These values include one or more overlap values in each dimension. In embodiments where high and low pass filters are used with D non-zero coefficients, the multi-dimensional array includes D−1 overlap value for each dimension. For example, in one embodiment a Haar Wavelet is utilized and, because the Haar Wavelet only comprises two coefficients for the high and low pass filters, one overlap value is used for each dimension. For the multi-dimensional arrays that include one or more of the borders of the input data, the overlap values may be mirrored from the opposite side of the array. The approach illustrated in FIG. 4 is particularly suited for, but not limited to, a multi-dimensional wavelet transform of level 1 and/or redundant wavelet transform where each computation unit may be leveraged for processing.

Using the method of partitioning data described in FIG. 4, multi-dimensional input data can be decomposed into many multi-dimensional arrays which can be processed independently on multiple computation units. Thus, with reference to the example FIG. 4, at 405 a computation unit 407 (e.g., thread block 230) processes the three-dimensional portion of the input data represented by cuboid 410. As illustrated at 410, while the first cuboid is being processed by computation unit 407, a second cuboid may be processed on a second portion of three-dimensional input data on a second computation unit. This strategy can be extended across any number of computation units, allowing all of the input data to be processed. Thus, for example, 420 and 425 show 4 and 8 cuboids, respectively, processing different portions of the three-dimensional input data in parallel on different computation units.

Figure 5:
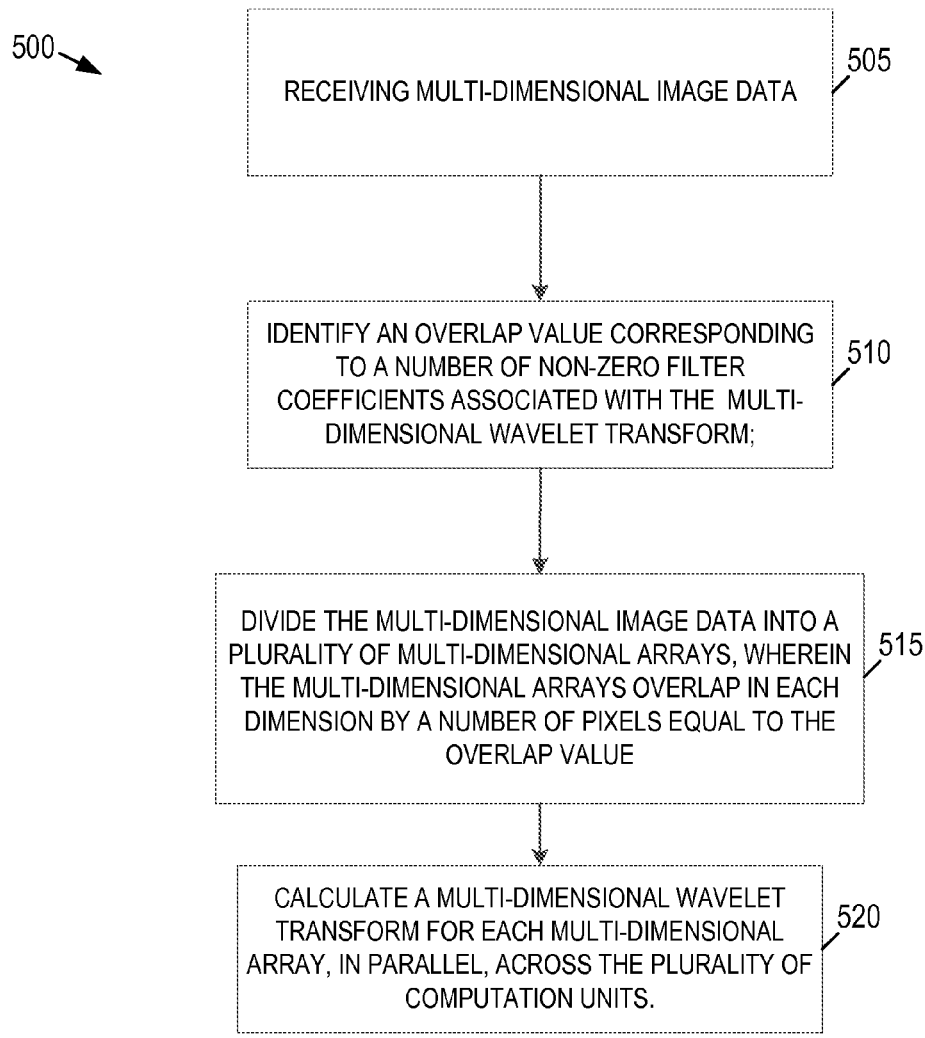
FIG. 5 illustrates a method for calculating a multi-dimensional wavelet transform in an image processing system, according to one embodiment of the present invention.

FIG. 5 provides illustrates a method 500 for calculating a multi-dimensional wavelet transform in an image processing system 100, according to some embodiments of the present invention. This method 500 can be applied to various embodiments of the imaging processing system 100, regardless of how the individual computation units of the system 100 are configured. For example in some embodiments the method 500 is applied to an image processing system comprising a plurality of computers operable coupled via a network and each computation unit is located within a distinct computer. Alternatively, in other embodiments, the method is applied where the computation units are thread blocks in a GPU.

In FIG. 5, multi-dimensional image data is initially received by the system 100 at 505. Next, at 510, the system 100 identifies an overlap value corresponding to the number of non-zero filter coefficients associated with the multi-dimensional wavelet transform (e.g., as described above with respect to FIG. 4). Then, at 520, the system 100 divides multi-dimensional image data into a plurality of multi-dimensional arrays, wherein the multi-dimensional arrays overlap in each dimension by a number of pixels equal to the overlap value.

Finally, at 520, the system 100 calculates a multi-dimensional wavelet transform for each multi-dimensional array, in parallel, across the plurality of computation units. How this calculation is performed can vary depending on the configuration of the system 100. For example, in one embodiment, each computation unit is assigned a multi-dimensional array. Then, each computation unit calculates a wavelet transform across each dimension of its assigned array. Finally, the result of the transform along the last dimension is copied from each computation unit and aggregated with the results of the other computation units. The results that are copied from each computation unit may exclude one or more values corresponding to the overlap between the multi-dimensional arrays. It should be noted that the wavelets utilized by the transform may vary depending on the application. Thus, for embodiments of the present invention utilized in image processing applications, compact wavelets such as the Haar wavelet may be used due to their ability to represent discontinues (e.g., edges) in the input signal. However, other compact and/or compact wavelets may also be used within the scope of the present disclosure.

Figure 6:
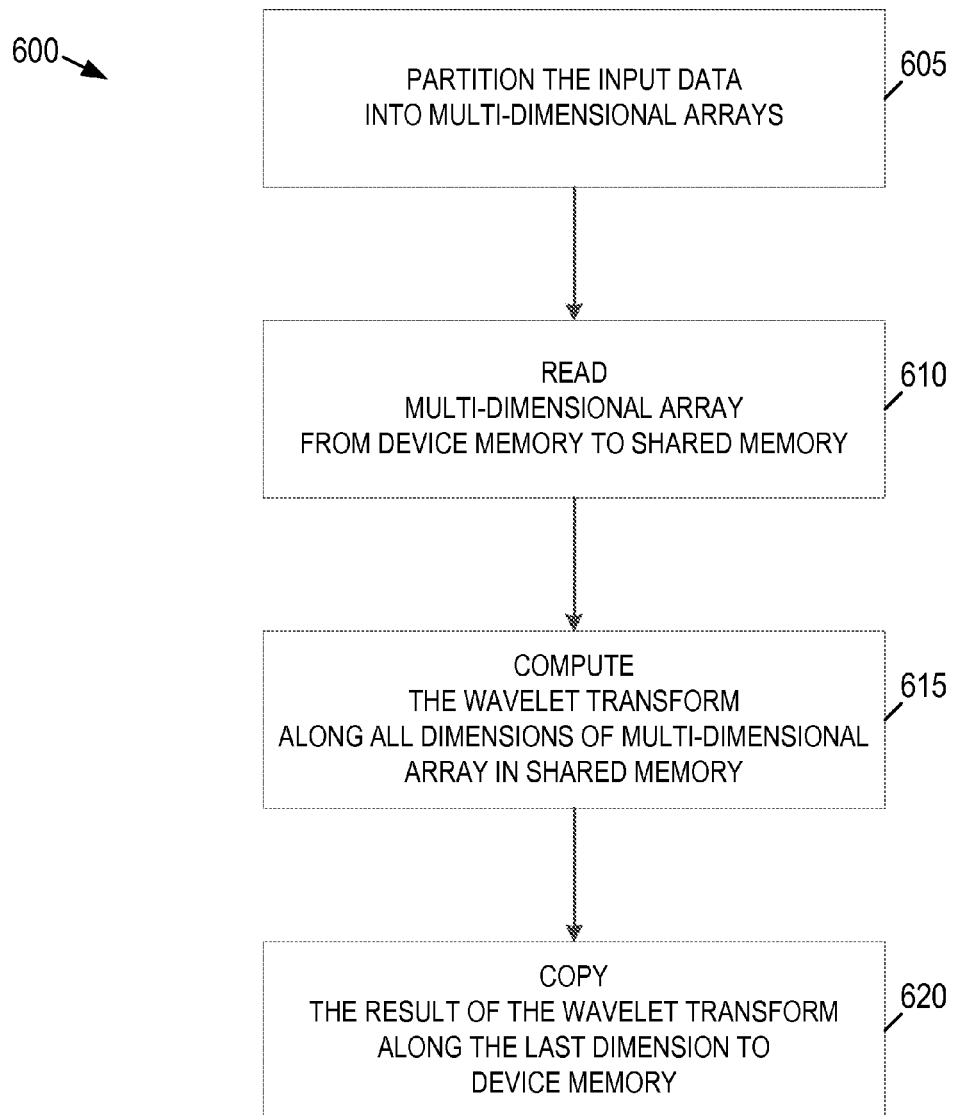
FIG. 6 illustrates a method of calculating a multi-dimensional wavelet transform in a GPU-based parallel computing platform, according to one embodiment of the present invention.

FIG. 6 provides illustrates a method 600 of calculating a multi-dimensional wavelet transform in a GPU-based parallel computing platform (e.g., NVIDIA™ CUDA) according to one embodiment of the present invention. This method may be performed, for example, by calling a kernel function from host 205 and executing code on device 210. First, at 605, the input data is partitioned into multi-dimensional arrays, for example, using the process illustrated in FIG. 4. Next, at 610 each thread block 230 on the device 210 reads a multi-dimensional array from device memory 220 into its shared memory 235. In some embodiments, this step may be omitted and the thread block may process the multi-dimensional array in global memory. However, because shared memory typically provides access latencies which are much less than that of global memory, shared memory is preferably utilized.

Continuing with reference to FIG. 6, at 615, a wavelet transform is computed along all dimensions of the multi-dimensional array while it is in shared memory. While computing the transform, intermediary results are stored in shared memory 235. Once the result of the wavelet transform along the last dimension is computed, at 620 it is copied back to device memory 220. In some embodiments, the result copied to device memory excludes the values corresponding to the overlap values included with the multi-dimensional input data. Depending on the number of thread blocks available and the size of the input data, steps 610, 615, and 620 may be performed in parallel for two or more of the multi-dimensional arrays generated from the input data.

The method of calculating a multi-dimensional wavelet transform described herein may be applied to various domains. For example, the transform may be used in combination with compressed sensing techniques to accelerate MRI acquisitions. Thus, according to another aspect or the present invention, the multi-dimensional wavelet transform described herein is used in combination with a generic computation strategy framework to allow calculations associated with MRI acquisitions to be performed across various hardware and software configurations. For example, the calculations may implement different computation strategies, such as utilizing either the CPU only or the CPU in combination with the GPU (e.g., via NVIDIA™ CUDA technology). By using a generic approach, the reconstruction algorithm, as well as other algorithms using in MRI acquisition, can be the same regardless of the hardware it is run on.

In some embodiments, the generic computation strategy framework includes wrapper software code which allows the reconstruction algorithm to be executed across different hardware configurations. The wrapper software code can include one or more classes, methods, or variables which encapsulate the functionality of one or more software components (e.g. a function, a set of functions, or a class). Thus, wrapper software code may provide a level of abstraction from the implementation of an underlying software component. For example, hardware-specific details such as variable types or memory operations may be abstracted using a wrapper software code. One or more parameters may be provided to the wrapper software code to customize its operation. These parameters may be supplied, for example, to a template interface used when a wrapper class is created or via variables passed to the wrapper method. Parameters which may be provided to the wrapper may include, without limitation, the desired numerical precision, data format, and/or computation strategy to be used for the when executing the wrapped software components. Thus, following this strategy, a high level of generality can be achieved allowing for statements such as c=A(b), where c would be the result of an operator A being applied to a generalized vector b. Depending on the parameters provided to A, lower-level software code within the wrapper software code may utilize specific values for items such as numerical precision, data format, and computation strategy.

In some embodiments, the generic computation strategy framework may be used to reconstruct an Magnetic Resonance ("MR") sequence. For example, reconstruction can be modeled by the optimization problem:

$$\arg_x \min \frac{1}{2} \|Ax - y\| + \lambda \|Wx\|_q.$$

In this equation, x denotes the real-world image of the object in the scanner in the image domain; y denotes the measured signal (i.e., acquired k-space MR image data); A denotes the combined sub-sampling, Fourier transform, and coil sensitivity operator; W is a wavelet matrix (e.g., a redundant Haar wavelet matrix); and λ is the regularization parameter. The value of q varies between 0 and 1 depending on the regularization technique used to solve the problem. For implementations of the present invention that utilize data parallelism (e.g., a CPU/GPU implementation using CUDA), a coupled reconstruction utilizing the correlation between adjacent columns in the image can give more accurate and faster results than a column-by-column reconstruction. The optimization problem set out above, as well as additional methods for reconstructing MRI images, are described in greater detail in U.S. Patent Application Publication No. 2013/0320974, filed Dec. 18, 2012, and entitled "Efficient Redundant Haar Minimization for Parallel MRI Reconstruction," which is hereby incorporated by reference in its entirety.

Figure 7:
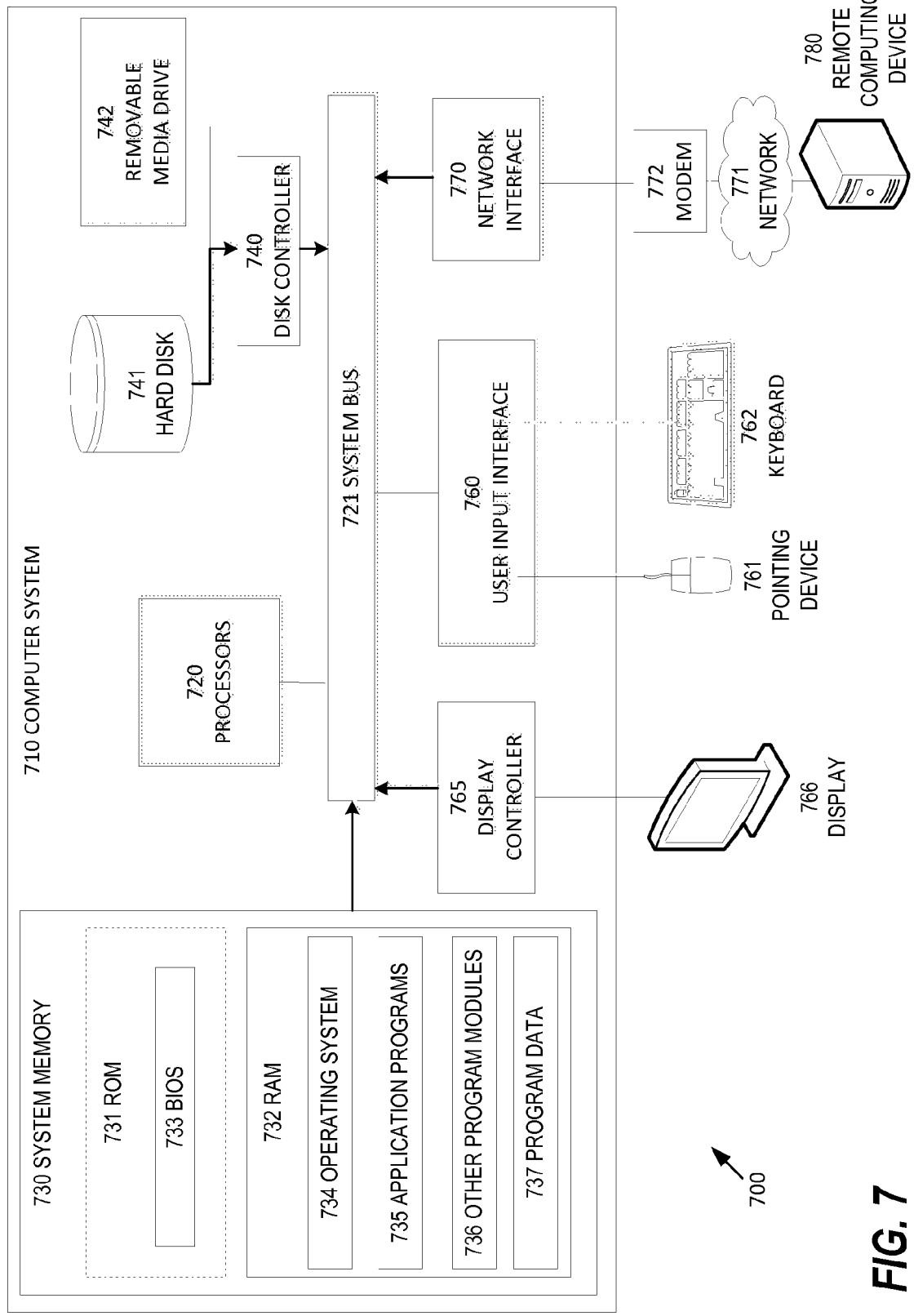
FIG. 7 illustrates an example of a computing environment within which embodiments of the invention may be implemented.

FIG. 7 illustrates an example of a computing environment 700 within which embodiments of the invention may be implemented. Computing environment 700 may include computer system 710, which is one example of a general purpose computing system upon which embodiments of the invention may be implemented. Computers and computing environments, such as computer 710 and computing environment 700, are known to those of skill in the art and thus are described briefly here.

As shown in FIG. 7, the computer system 710 may include a communication mechanism such as a bus 721 or other communication mechanism for communicating information within the computer system 710. The system 710 further includes one or more processors 720 coupled with the bus 721 for processing the information. The processors 720 may include one or more CPUs, GPUs, or any other processor known in the art.

The computer system 710 also includes a system memory 730 coupled to the bus 721 for storing information and instructions to be executed by processors 720. The system memory 730 may include computer readable storage media in the form of volatile and/or nonvolatile memory, such as read only memory (ROM) 731 and/or random access memory (RAM) 732. The system memory RAM 732 may include other dynamic storage device(s) (e.g., dynamic RAM, static RAM, and synchronous DRAM). The system memory ROM 731 may include other static storage device(s) (e.g., programmable ROM, erasable PROM, and electrically erasable PROM). In addition, the system memory 730 may be used for storing temporary variables or other intermediate information during the execution of instructions by the processors 720. A basic input/output system 733 (BIOS) containing the basic routines that help to transfer information between elements within computer system 710, such as during start-up, may be stored in ROM 731. RAM 732 may contain data and/or program modules that are immediately accessible to and/or presently being operated on by the processors 720. System memory 730 may additionally include, for example, operating system 734, application programs 735, other program modules 736 and program data 737.

The computer system 710 also includes a disk controller 740 coupled to the bus 721 to control one or more storage devices for storing information and instructions, such as a magnetic hard disk 741 and a removable media drive 742 (e.g., floppy disk drive, compact disc drive, tape drive, and/or solid state drive). The storage devices may be added to the computer system 710 using an appropriate device interface (e.g., a small computer system interface (SCSI), integrated device electronics (IDE), Universal Serial Bus (USB), or FireWire).

The computer system 710 may also include a display controller 765 coupled to the bus 721 to control a display or monitor 765, such as a cathode ray tube (CRT) or liquid crystal display (LCD), for displaying information to a computer user. The computer system includes an input interface 760 and one or more input devices, such as a keyboard 762 and a pointing device 761, for interacting with a computer user and providing information to the processor 720. The pointing device 761, for example, may be a mouse, a trackball, or a pointing stick for communicating direction information and command selections to the processor 720 and for controlling cursor movement on the display 766. The display 766 may provide a touch screen interface which allows input to supplement or replace the communication of direction information and command selections by the pointing device 761.

The computer system 710 may perform a portion or all of the processing steps of embodiments of the invention in response to the processors 720 executing one or more sequences of one or more instructions contained in a memory, such as the system memory 730. Such instructions may be read into the system memory 730 from another computer readable medium, such as a hard disk 741 or a removable media drive 742. The hard disk 741 may contain one or more datastores and data files used by embodiments of the present invention. Datastore contents and data files may be encrypted to improve security. The processors 720 may also be employed in a multi-processing arrangement to execute the one or more sequences of instructions contained in system memory 730. In alternative embodiments, hard-wired circuitry may be used in place of or in combination with software instructions. Thus, embodiments are not limited to any specific combination of hardware circuitry and software.

As stated above, the computer system 710 may include at least one computer readable medium or memory for holding instructions programmed according embodiments of the invention and for containing data structures, tables, records, or other data described herein. The term "computer readable medium" as used herein refers to any medium that participates in providing instructions to the processor 720 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 741 or removable media drive 742. Non-limiting examples of volatile media include dynamic memory, such as system memory 730. Non-limiting examples of transmission media include coaxial cables, copper wire, and fiber optics, including the wires that make up the bus 721. Transmission media may also take the form of acoustic or light waves, such as those generated during radio wave and infrared data communications.

The computing environment 700 may further include the computer system 720 operating in a networked environment using logical connections to one or more remote computers, such as remote computer 780. Remote computer 780 may be a personal computer (laptop or desktop), a mobile device, a server, a router, a network PC, a peer device or other common network node, and typically includes many or all of the elements described above relative to computer 710. When used in a networking environment, computer 710 may include modem 772 for establishing communications over a network 771, such as the Internet. Modem 772 may be connected to system bus 721 via user network interface 770, or via another appropriate mechanism.

Network 771 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 710 and other computers (e.g., remote computing system 780). The network 771 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 771.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A computer-implemented method for calculating a multi-dimensional wavelet transform in an image processing system comprising a plurality of computation units, the method comprising:

receiving multi-dimensional image data;

identifying an overlap value corresponding to a number of non-zero filter coefficients associated with the multi-dimensional wavelet transform;

dividing the multi-dimensional image data into a plurality of multi-dimensional arrays, wherein the multi-dimensional arrays overlap in each dimension by a number of pixels equal to the overlap value; and calculating a multi-dimensional wavelet transform for each multi-dimensional array, in parallel, across the plurality of computation units;

receiving a multi-dimensional wavelet transform result from each of the plurality of computation units, wherein each respective multi-dimensional wavelet transform result excludes values corresponding to overlapping pixels included in the plurality of multi-dimensional arrays; and aggregating the multi-dimensional wavelet transform results in a memory included in the image processing system.

2. The method of claim 1, wherein the calculating the multi-dimensional wavelet transform for each multi-dimensional array, in parallel, across the plurality of computation units comprises:
receiving, by a respective computation unit, a respective assigned multi-dimensional array;
calculating, by the respective computation unit, a wavelet transform across each dimension of the respective assigned multi-dimensional array;
identifying, by the respective computation unit, a final wavelet transform result for the respective assigned multi-dimensional array; and
copying the final wavelet transform result from the respective computation unit to each of the plurality of computation units.

3. The method of claim 2, wherein the identifying the final wavelet transform result for the multi-dimensional array comprises:
determining, by the respective computation unit, a calculated wavelet transform result for the respective assigned multi-dimensional array based on the calculation of the wavelet transform across each dimension of the assigned multi-dimensional array;
identifying, by the respective computation unit, values in the calculated wavelet transform result corresponding to an overlap between the a respective assigned multi-dimensional array and one or more of the plurality of multi-dimensional arrays; and
excluding the values from the calculated wavelet transform result to identify the final wavelet transform result.

4. The method of claim 2, wherein the copying the final wavelet transform result from the respective computation unit to each of the plurality of computation units comprises:
identifying values in the final wavelet transform result corresponding to an overlap between the respective assigned multi-dimensional array and one or more of the plurality of multi-dimensional arrays; and
copying all values in the final wavelet transform result from the respective computation unit except for those values corresponding to the overlap.

5. The method of claim 1, wherein the image processing system comprises a plurality of computers operably coupled via a network and each computation unit is located within a distinct computer.

6. The method of claim 1, wherein the plurality of computation units comprise thread blocks in a graphical processing unit.

7. The method of claim 6, wherein each multi-dimensional array is sized based on a maximum number of threads available to each thread block.

8. The method of claim 6, wherein each multi-dimensional array is sized based on an amount of memory exclusively available to each thread block.

9. A method for calculating a transform of a multi-dimensional signal in a system comprising a plurality of computation units, the method comprising:
dividing, in a first memory associated with a computer, data corresponding to the multi-dimensional signal into a plurality of multi-dimensional arrays, wherein the multi-dimensional arrays overlap in each dimension;
assigning each multi-dimensional array to one of the plurality of computation units; and
for each computation unit, performing a transform calculation process comprising:
copying an assigned multi-dimensional array from the first memory to a second memory, wherein the second memory is only accessible to the respective computation unit,
calculating the transform along each dimension of the assigned multi-dimensional array in the second memory,
identifying a calculated result of the transform along a last dimension,
identifying overlap values in the calculated result corresponding to an overlap between the assigned multi-dimensional array and one or more of the plurality of multi-dimensional arrays, and
copying all values from the calculated result with the exception of the overlap values to the first memory.

10. The method of claim 9, wherein the transform calculation process is performed independently by each computation unit without communicating with any other computation unit in the plurality of computation units.

11. The method of claim 10, wherein the transform calculation process is performed by each computation unit, on its respective multi-dimensional array, in parallel.

12. The method of claim 9, wherein the plurality of computation units comprises thread blocks in a graphical processing unit.

13. The method of claim 9, wherein the transform comprises a discrete wavelet transform.

14. The method of claim 9, wherein the transform comprises an inverse discrete wavelet transform.

15. An image processing system for calculating a multi-dimensional wavelet transform, the system comprising:
a receiver configured to receive a multi-dimensional image from an imaging device;
a first processor comprising a plurality of processor cores; and
a second processor configured to call a software function operable to cause the first processor to:
divide the multi-dimensional image data into a plurality of overlapping multi-dimensional arrays,
calculate a multi-dimensional wavelet transform for each multi-dimensional array, in parallel, across the plurality of processor cores,
receive a multi-dimensional wavelet transform result from each of the plurality of computation units, wherein each respective multi-dimensional wavelet transform result excludes values corresponding to overlapping pixels included in the plurality of multi-dimensional arrays, and
aggregate the multi-dimensional wavelet transform results in a memory included in the image processing system.

16. The system of claim 15, wherein the first processor comprises a graphical processing unit and the plurality of processor cores execute a plurality of thread blocks.

17. The system of claim 16, wherein a size of each multi-dimensional array is based on a maximum number of threads available to each thread block.

18. The system of claim 16, wherein the multi-dimensional arrays overlap by a number of pixels corresponding to a number of non-zero filter coefficients associated with the multi-dimensional wavelet transform.

* * * * *